United States Patent
Zhou et al.

(10) Patent No.: US 9,123,906 B2
(45) Date of Patent: Sep. 1, 2015

(54) ORGANIC ELECTROLUMINESCENCE DEVICE AND MANUFACTURING METHOD THEREOF

(75) Inventors: Mingjie Zhou, Shenzhen (CN); Ping Wang, Shenzhen (CN); Hui Huang, Shenzhen (CN); Xiaoming Feng, Shenzhen (CN)

(73) Assignee: OCEAN'S KING LIGHTING SCIENCE & TECHNOLOGY CO., LTD., Shenzhen (CN)

( * ) Notice: Subject to any disclaimer, the term of this patent is extended or adjusted under 35 U.S.C. 154(b) by 196 days.

(21) Appl. No.: 13/823,044

(22) PCT Filed: Sep. 30, 2010

(86) PCT No.: PCT/CN2010/077505
§ 371 (c)(1),
(2), (4) Date: Mar. 13, 2013

(87) PCT Pub. No.: WO2012/040926
PCT Pub. Date: Apr. 5, 2012

(65) Prior Publication Data
US 2013/0214262 A1   Aug. 22, 2013

(51) Int. Cl.
*H01L 51/50* (2006.01)
*H01L 51/56* (2006.01)
*H01L 51/00* (2006.01)

(52) U.S. Cl.
CPC .......... *H01L 51/50* (2013.01); *H01L 51/5012* (2013.01); *H01L 51/5088* (2013.01); *H01L 51/5092* (2013.01); *H01L 51/56* (2013.01); *H01L 51/0036* (2013.01)

(58) Field of Classification Search
CPC .. H01L 51/56; H01L 51/5012; H01L 51/5092
USPC .................................. 257/40, 13; 438/29, 99
See application file for complete search history.

(56) References Cited

U.S. PATENT DOCUMENTS

2004/0113146 A1   6/2004   Dahmani et al.
2011/0192464 A1*  8/2011   Urano et al. ................. 136/263

FOREIGN PATENT DOCUMENTS

CN          1851955          10/2006
CN          1851955 A        10/2006
(Continued)

OTHER PUBLICATIONS

International Search Report of corresponding application International No. PCT/CN2010/077505.
(Continued)

*Primary Examiner* — Howard Weiss
*Assistant Examiner* — Tifney Skyles
(74) *Attorney, Agent, or Firm* — Hoffmann & Baron, LLP

(57) ABSTRACT

An organic electroluminescence device is provided. The device comprises an anode base layer (110), a hole injection layer (120) on the anode base layer (110), a light emitting layer (130) on the hole injection layer (120), and a cathode electrode layer (140) on the light emitting layer (130). The material of the hole injection layer (120) is metal oxide or thiophene type compound. The hole injection layer (120) has advantages of improving the recombination probability of electron-hole and not being easily oxidized, so that the efficiency of the organic electroluminescence device is increased and the service life is prolonged. A method for manufacturing the organic electroluminescence device is also provided.

8 Claims, 2 Drawing Sheets

(56) References Cited

FOREIGN PATENT DOCUMENTS

| | | |
|---|---|---|
| CN | 101084588 | 12/2007 |
| CN | 101084588 A | 12/2007 |
| CN | 101578719 | 11/2009 |
| CN | 101765930 | 6/2010 |
| CN | 101765930 A | 6/2010 |
| EP | 2178132 A1 | 4/2010 |
| EP | 2624324 A1 | 7/2013 |
| JP | 06-342690 | 12/1994 |
| JP | 10-199681 | 7/1998 |
| JP | 200422292 | 1/2004 |
| JP | 200780744 | 3/2007 |
| JP | 200841894 | 2/2008 |
| JP | 2008515194 | 5/2008 |
| JP | 200944105 | 2/2009 |
| JP | 2010-103500 | 5/2010 |
| JP | 2010-080269 | 8/2010 |
| JP | 2013530520 | 12/2013 |
| WO | 2006036755 | 4/2006 |
| WO | 2009123763 A2 | 10/2009 |

OTHER PUBLICATIONS

Tokito et al, "Metal oxides as a hole-injecting layer for an organic electroluminescent device", Toyota Central Research and Development Laboratories Inc., Jul. 1996.

* cited by examiner

ORGANIC ELECTROLUMINESCENCE DEVICE AND MANUFACTURING METHOD THEREOF

CROSS-REFERENCE TO RELATED APPLICATIONS

This application is a national stage filing of International Application No. PCT/CN2010/077505, filed on Sep. 30, 2010, the entirety of which is incorporated herein by reference.

TECHNICAL FIELD

The present invention relates to an organic electroluminescent device and a method for preparing the same.

BACKGROUND

In 1987, C. W. Tang and Van Slyke of Eastman Kodak Company, USA, reported a breakthrough in organic electroluminescent research. A double-layer small-molecular organic electroluminescent device with high brightness and high efficiency was prepared by vacuum coating technology. In 1990, R. H. Friend group of the University of Cambridge prepared the first polymeric light-emitting diodes. Since then, Organic Light-Emitting Diode (OLED) has been developed to the application stage in less than twenty years.

However, the hole injection layer of the traditional organic electroluminescent device commonly employs small organic molecules, which may be susceptible to oxidation and may be unstable. This affects the service life and the efficiency of the organic electroluminescent device.

SUMMARY

In view of the above, it is necessary to provide an organic electroluminescent device which has a longer service life and a better performance.

An organic electroluminescent device comprises an anode base layer, a hole injection layer provided on the anode base layer, a light emitting layer provided on the hole injection layer, and a cathode electrode layer provided on the light emitting layer, wherein the material for the hole injection layer is a metal oxide or a thiophene compound.

Preferably, the metal oxide is at least one of zinc oxide, magnesium oxide and vanadium pentoxide; and the thiophene compound is at least one of poly(3-hexyl thiophene), poly(3-methyl thiophene), poly(3-octyloxy thiophene) and poly(3-dodecyl thiophene).

Preferably, the organic electroluminescent device further comprises at least one of a hole transport layer between the hole injection layer and the light emitting layer, an electron transport layer between the light emitting layer and the cathode electrode layer, and an electron injection layer between the electron transport layer and the cathode electrode layer.

The hole injection layer formed by the metal oxide or the thiophene compound is characterized in that it may improve the probability of electron-hole recombination, and it is not susceptible to oxidation, thereby enhancing the efficiency of the organic electroluminescent device and extending its service life.

Furthermore, the metal oxide such as zinc oxide, magnesium oxide, vanadium pentoxide, etc. and the thiophene compound such as poly(3-hexyl thiophene), poly(3-methyl thiophene), poly(3-octyloxy thiophene), poly(3-dodecyl thiophene), etc., comparing with traditionally used small organic molecules, are not susceptible to oxidation, may keep stable for a long time, and have a relatively strong hole-injecting ability.

Metal oxide materials have relatively strong absorption in the UV range, and can play the role of shielding UV lights. As UV irradiation greatly affects the stability of the device, a metal oxide material may be selected to effectively improve the stability of the device, and slow down the aging of the device.

Poly(alkyl thiophene)-based polymers have a side-chain group with a certain length on the thiophene moiety, while these alkyl side chains may increase the distance between the chains, so that the transport of holes is restricted in the main chain, thereby increasing the probability of the electron-hole recombination, and effectively enhancing the luminescent intensity and the luminescent brightness of the device.

In addition, it is necessary to provide a method for preparing an organic electroluminescent device having a longer service life.

A method for preparing an organic electroluminescent device comprises the steps of:

S1, preparing a metal oxide sol or a thiophene compound sol;
S2, providing an anode base layer, and conducting a pretreatment on a surface of the anode base layer;
S3, applying the metal oxide sol or the thiophene compound sol on the pretreated surface of the anode base layer using a spin coating technique to form a hole injection layer; applying a light emitting layer on the hole injection layer; applying a cathode electrode layer on the light emitting layer; and drying to give the organic electroluminescent device.

Preferably, in step S1, preparing the metal oxide sol comprises the steps of: dissolving a metal oxide in a solvent to prepare the metal oxide sol having a concentration of 10-35%.

Preferably, the metal oxide is zinc oxide or magnesium oxide, and the solvent is a mixture of water and acetic acid in a volume ratio of 1:2; or the metal oxide is vanadium pentoxide, and the solvent is ammonia.

Preferably, when the raw material for forming the hole injection layer is a metal oxide sol, the process of spin coating comprises: a rotational speed of 500-2000 rpm, and a coating time of 30 s; and the drying process comprises: a drying temperature of 50-200° C., and a drying time of 15-60 min.

Preferably, in step S1, preparing the thiophene compound sol comprises the steps of: dissolving a thiophene compound in an organic solvent to prepare the a thiophene compound sol having a concentration of $1\times10^{-3}\sim1\times10^{-2}$ g/L.

Preferably, the thiophene compound is poly(3-hexyl thiophene), poly(3-methyl thiophene), poly(3-octyloxy thiophene) or poly(3-dodecyl thiophene); and the organic solvent is at least one of chlorobenzene, xylene, tetrahydrofuran, trichloromethane or dichloromethane.

Preferably, when the raw material for forming the hole injection layer is a thiophene compound sol, the process of spin coating comprises: a rotational speed of 500-2500 rpm, and a coating time of 30 s; and the drying process comprises: a drying temperature of 50-200° C., and a drying time of 15-100 min.

In the above method for preparing an organic electroluminescent device, the hole injection layer is prepared by spin coating the metal oxide material or the thiophene compound material. The process is simple, has low requirements on the equipments, is easy to operate, and can greatly reduce the production cost of the device.

SPECIFIC EMBODIMENTS

In the following, the organic electroluminescent device and the method for preparing the same are further described in detail in combination with the Figures and specific Examples.

Figure 1:
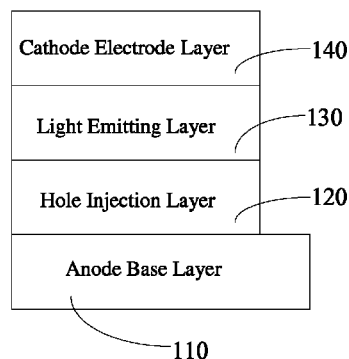
FIG. 1 shows a scheme of the structure of the organic electroluminescent device of an embodiment.

As shown in FIG. 1, the organic electroluminescent device according to an embodiment comprises sequentially an anode base layer 110, a hole injection layer 120, a light emitting layer 130 and a cathode electrode layer 140.

The anode base layer 110 may be formed from an inorganic conductive material, such as indium tin oxide (ITO), zinc oxide or tin oxide; or an organic conductive polymer, such as polyaniline.

The hole injection layer 120 may be prepared from a metal oxide or a thiophene compound, wherein the metal oxide may be, for example, zinc oxide, magnesium oxide, vanadium pentoxide, or the like; and the thiophene compound may be, for example, poly(3-hexyl thiophene), poly(3-methyl thiophene), poly(3-octyloxy thiophene), poly(3-dodecyl thiophene), or the like.

The light emitting layer 130 may be formed from tetra-tert-butyl-perylene (TBP), 4-(dicyanomethyl)-2-butyl-6-(1,1,7,7-tetramethyljulolidinyl-9-vinyl)-4H-pyran (DCJTB), 9,10-di(beta-naphthyl) anthracene (AND), Bis-(2-methyl-8-quinolinolato)-4-(phenyl-phenolato)-aluminium (BALM), 4-(dicyanomethylene)-2-i-propyl-6-(1,1,7,7-tetramethylju-lolidinyl-9-vinyl)-4H-pyran (DCJTI), dimethyl quinacridone (DMQA), or tris(8-quinolinolato)aluminum (Alq$_3$). In addition, the light emitting layer 130 may also be formed from a polymer such as poly(p-phenylene vinylene) or a derivative thereof (PPV).

The cathode electrode layer 140 may be formed from aluminum, gold, magnesium-silver alloy, aluminum-magnesium alloy, aluminum-calcium alloy, aluminum-lithium alloy, or the like.

The hole injection layer 120 is prepared from a metal oxide or an organic polymer, which is not susceptible to oxidation. Accordingly, the stability and the service life of the organic electroluminescent device can be effectively improved. Meanwhile, the metal oxide or the organic polymer can balance the transporting rates of the holes and the electrons, increase the probability of hole-electron recombination, and effectively increase the luminescent intensity and the luminescent brightness of the device.

Figure 2:
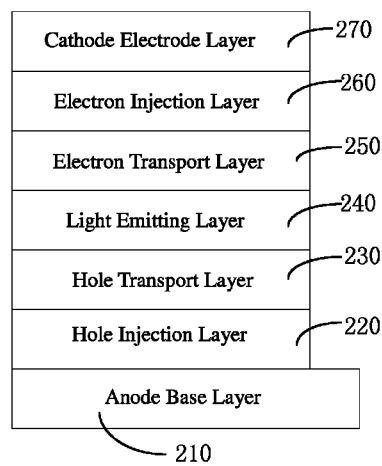
FIG. 2 shows a scheme of the structure of the organic electroluminescent device of another embodiment.

In addition, in order to further increase the transporting rates of the holes and the electrons in the organic electroluminescent device, the organic electroluminescent device may also employ structures such as: an anode base layer/a hole injection layer/a light emitting layer/an electron injection layer/a cathode electrode layer; an anode base layer/a hole injection layer/a light emitting layer/an electron transport layer/a cathode electrode layer; an anode base layer/a hole injection layer/a light emitting layer/an electron transport layer/an electron injection layer/a cathode electrode layer; an anode base layer/a hole injection layer/a hole transport layer/a light emitting layer/an electron injection layer/a cathode electrode layer; an anode base layer/a hole injection layer/a hole transport layer/a light emitting layer/an electron transport layer/a cathode electrode layer; an anode base layer/a hole injection layer/a hole transport layer/a light emitting layer/an electron transport layer/an electron injection layer/a cathode electrode layer; or the like. FIG. 2 shows a scheme of the structure of an organic electroluminescent device sequentially comprising an anode base layer 210/a hole injecting layer 220/a hole transporting layer 230/a light emitting layer 240/an electron transport layer 250/an electron injecting layer 260/a cathode electrode layer 270.

The hole transport layer may be prepared from N,N'-di(3-methylphenyl)-N,N'-diphenyl-4,4'-biphenyl diamine (TPD), poly(p-phenylene vinylene) or a derivative thereof (PPV), N,N'-(1-naphthyl)-N,N-diphenyl-4,4'-biphenyl diamine (NPB), 1,3,5-triphenylbenzene (TDAPB), polyvinylcarbazole (PVK), phthalocyanine copper (CuPc), P-type doped inorganic semiconductor, or the like.

The electron transport layer may be prepared from 2-(4-biphenyl)-5-(4-tert-butyl)phenyl-1,3,4-oxadiazole (PBD), 8-hydroxyquinoline aluminum (Alq$_3$), 2,5-bis(1-naphthyl)-1,3,4-diazole (BND), 1,2,4-triazole derivative (TAZ), N-aryl benzimidazole (TPBI), quinoxaline derivative (TPQ) or n-type doped inorganic semiconductor.

The electron injection layer may be prepared from lithium fluoride (LiF), lithium oxide (LiO$_2$), cesium oxide (Cs$_2$O), aluminum oxide (Al$_2$O$_3$), sodium fluoride (NaF), cesium fluoride (CsF), calcium fluoride (CaF$_2$), magnesium fluoride (MgF$_2$), sodium chloride (NaCl), potassium chloride (KCl), rubidium chloride (RbCl), lithium metaborate (LiBO$_2$), potassium silicate (K$_2$SiO$_3$), or the like.

A method for preparing the above organic electroluminescent device having a structure of an anode base layer 110/a hole injection layer 120/a light emitting layer 130/a cathode electrode layer 140 comprises: first preparing a metal oxide sol or a thiophene compound sol; then providing an anode base layer 110, and subjecting a surface thereof to a pretreatment; and finally applying the metal oxide sol or the thiophene compound sol on the pretreated surface of the anode base layer 110 using a spin coating technique to form a hole injection layer 120; applying a light emitting layer 130 on the hole injection layer 120; applying a cathode electrode layer 140 on the light emitting layer 130, and drying to give the organic electroluminescent device.

In the method, the pretreatment on the surface of the anode base layer 110 may be oxygen plasma treatment, UV-ozone treatment, hydrogen peroxide soaking treatment, acid soaking treatment, or the like.

The raw material for the hole injection layer 120 may specifically be a deionized water/acetic acid sol of zinc oxide or magnesium oxide with a mass fraction of 10-35%, wherein the volume ratio of deionized water and acetic acid may be 1:2; or an ammonia sol of vanadium pentoxide with a mass fraction of 10-35%; or an organic solvent sol of poly(3-hexyl thiophene), poly(3-methyl thiophene), poly(3-octyl thiophene) or poly(3-dodecyl thiophene) with a concentration of $1\times10^{-3}$–$1\times10^{-2}$ g/L.

When the raw material for the hole injection layer 120 is a sol containing zinc oxide, magnesium oxide or vanadium pentoxide, the process of spin coating may comprise: a rotational speed of 500-2000 rpm, and a spin coating time of 30 s; and the drying process comprises: a drying temperature of 50-200° C., and a drying time of 15-60 min.

When the raw material for the hole injection layer 120 is an organic solvent sol of poly(3-hexyl thiophene), poly(3-methyl thiophene), poly(3-octyloxy thiophene) or poly(3-dodecyl thiophene), the process of spin coating may comprise: a rotational speed of 500-2500 rpm, and a spin coating time of 30 s; and the drying process comprises: a drying temperature of 50-200° C., and a drying time of 15-100 min, and the organic solvent is at least one of chlorobenzene, xylene, tetrahydrofuran, trichloromethane or dichloromethane.

In addition, in order to further increase the hole-electron transport rate of the organic electroluminescent device, the above-mentioned preparation process further comprises a step of depositing a hole transport layer between the hole injection layer and the light emitting layer by spin coating, vapor deposition, sputtering, jet plating or chemical vapor deposition, or steps of depositing an electron transport layer on the light emitting layer and depositing an electron injection layer between the electron transport layer and the cathode electrode layer by spin coating, vapor deposition, sputtering, jet plating or chemical vapor deposition.

The process of spin coating the metal oxide material or the organic polymeric material to prepare the hole injection layer is simple, has low requirements on the equipments, is easy to operate, and can greatly reduce the production cost of the device.

In the following are specific Examples.

EXAMPLE 1

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma surface treatment for 5-15 min at a power of 10-50 W. The main role thereof is to reduce the roughness and the contact angle of the surface of the anode base layer and to facilitate improving the wettability and absorption of the surface of the anode base layer. In addition, by the surface treatment, organic contaminants on the surface of the anode base layer can be further removed, the combination thereof with organic layer can be improved, the work function of the surface of the anode base layer can be increased, and the hole injecting ability can therefore be increased. Zinc oxide (ZnO) and a mixture of deionized water/acetic acid in a ratio of 1:2 are prepared into a solution with a mass fraction of 10%. The prepared solution is dripped on a spin coater and spin coated on the anode base layer at a rotating speed of 500-2000 rpm for 30 s. The coated anode base layer is then heated in an oven at 150° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 2

Figure 3:
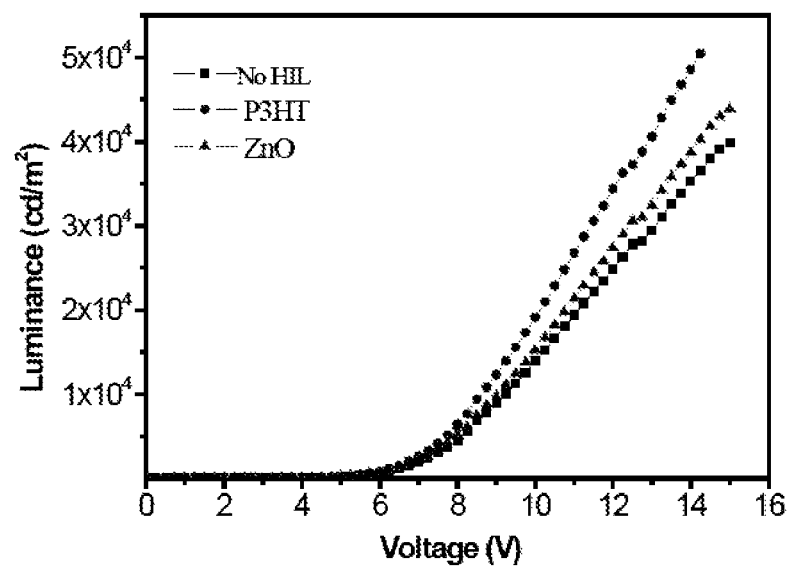
FIG. 3 shows the curves of luminance (in cd/m$^2$) vs voltage (in V) for the organic electroluminescent devices of Examples 2, 8 and 10, wherein the structure of the organic electroluminescent devices of Examples 2 and 8 is ITO (indium tin oxide)/a hole injection layer/NPB (N,N'-(1-naphthyl)-N,N'-diphenyl-4,4'-biphenyldiamine)/Alq$_3$ (8-hydroxy-quinoline aluminum)/LiF/Al layered structure, and that of Example 10 is ITO/NPB/Alq$_3$/LiF/Al, without a hole injection layer.

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma treatment for 5-15 min at a power of 10-50 W. Zinc oxide (ZnO) and a mixture of deionized water/acetic acid in a ratio of 1:2 are prepared into a solution with a mass fraction of 25%. The prepared solution is dripped on a spin coater and spin coated on the anode base layer at a rotating speed of 500-2000 rpm for 30 s. The coated anode base layer is then heated in an oven at 150° C. for 30 min. After drying, the hole injection layer is obtained, onto which the hole transport layer and the light emitting layer are prepared by thermal vapor deposition, and then the electron injection layer and the cathode electrode layer are prepared by vapor deposition. The curve of luminance vs voltage for the obtained organic electroluminescent device is shown in FIG. 3.

EXAMPLE 3

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to UV-ozone treatment for 15-30 min at a power of 10-30 W. Zinc oxide (ZnO) and a mixture of deionized water/acetic acid in a ratio of 1:2 prepared into a solution with a mass fraction of 35%. The prepared solution is dripped on a spin coater and spin coated on the anode base layer at a rotating speed of 500-2000 rpm for 30 s. The coated anode base layer is then heated in an oven at 150° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 4

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to UV-ozone treatment for 15-30 min at a power of 10-30 W. Zinc oxide (ZnO) in Example 1 is replaced with magnesium oxide (MgO), which is prepared into a solution with a mass ratio of 10% in a mixture of deionized water/acetic acid in a ratio of 1:2. The prepared solution is dripped on a spin coater and spin coated on the anode base layer at a rotating speed of 500-5000 rpm for 30 s. The coated anode base layer is then heated in a muffle furnace at 450° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 5

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma treatment for 5-15 min at a power of 10-50 W. Zinc oxide (ZnO) in Example 1 is replaced with magnesium oxide (MgO), which is prepared into a solution with a mass ratio of 30% in a mixture of deionized water/acetic acid in a ratio of 1:2. The prepared solution is dripped on a spin coater and spin coated on the anode base layer at a rotating speed of 500-5000 rpm for 30 s. The coated anode base layer is then heated in a muffle furnace at 450° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 6

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma treatment for 5-15 min at a power of 10-50 W. Zinc oxide (ZnO) in Example 1 is replaced with magnesium oxide (MgO), which is prepared into a solution with a mass ratio of 20% in a mixture of deionized water/acetic acid in a ratio of 1:2. The prepared solution is dripped on a spin coater and spin coated on the anode base layer at a rotating speed of 500-5000 rpm for 30 s. The coated anode base layer is then heated in a muffle furnace at 450° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 7

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma treatment for 5-15 min at a power of 10-50 W. Zinc oxide (ZnO) in Example 1 is replaced with poly(3-hexyl thiophene), which is prepared into a solution with a concentration of $1\times10^{-3}$ g/L in chlorobenzene. The prepared solution is dripped on a spin coater and spin coated on the anode base layer at a rotating speed of 500-2500 rpm for 30 s. The coated anode base layer is then heated in a oven at 200° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 8

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma treatment for 5-15 min at a power of 10-50 W. Zinc oxide (ZnO) in Example 1 is replaced with poly(3-hexyl thiophene), which is prepared into a solution with a concentration of $5\times10^{-3}$ g/L in chlorobenzene. The prepared solution is dripped on a spin coater and spin coated on the anode base layer at a rotating speed of 500-2500 rpm for 30 s. The coated anode base layer is then heated in a oven at 200° C. for 30 min. After drying, the hole injection layer is obtained, onto which the hole transport layer and the light emitting layer are prepared by thermal vapor deposition, and then the electron injection layer and the cathode electrode layer are prepared by vapor deposition. The curve of luminance vs voltage for the obtained organic electroluminescent device is shown in FIG. 3

EXAMPLE 9

An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to UV-ozone treatment for 15-30 min at a power of 10-30 W. Zinc oxide (ZnO) in Example 1 is replaced with poly(3-hexyl thiophene), which is prepared into a solution with a concentration of $1\times10^{-2}$ g/L in chlorobenzene. The prepared solution is dripped on a spin coater and spin coated on the anode base layer at a rotating speed of 500-2500 rpm for 30 s. The coated anode base layer is then heated in a oven at 200° C. for 30 min. After drying, the hole injection layer is obtained, onto which the hole transport layer, the light emitting layer and the electron transport layer are prepared by thermal vapor deposition, and then the electron injection layer and the cathode electrode layer are prepared by vapor deposition.

EXAMPLE 10

A comparative device without the hole injection layer: An indium tin oxide glass is subjected to a photolithographic treatment, cut into a desired light emitting area, and then sonicated sequentially in a detergent, deionized water, acetone, ethanol and isopropanol, each for 15 min. After cleaning, the glass is subjected to oxygen plasma treatment for 5-15 min at a power of 10-50 W. No hole injection layer is formed. The hole transport layer and the light emitting layer are directly prepared by thermal vapor deposition, and then the electron injection layer and the cathode electrode layer are prepared by vapor deposition.

The above Examples illustrate only several embodiments of the present invention, and the description is specific and in detail. However, this cannot be understood as a limitation to the scope of the present invention. It should be noted that, for a person having ordinary skill in the art, certain modifications and improvements may be made without departing from the inventive concept, which shall be within the scope sought protection in the present invention. Therefore, the scope sought protection in the present invention should be subject to the appended claims.

What is claimed is:

1. A method for preparing an organic electroluminescent device, comprising the steps of:
   S1, preparing a metal oxide sol or a thiophene compound sol, wherein preparing the thiophene compound sol comprises the steps of: dissolving a thiophene compound in an organic solvent to prepare the a thiophene compound sol having a concentration of $1\times10^{-3}\sim1\times10^{-2}$ g/L;
   S2, providing an anode base layer, and conducting a pretreatment on a surface of the anode base layer;
   S3, applying the metal oxide sol or the thiophene compound sol on the pretreated surface of the anode base layer using a spin coating technique to form a hole injection layer; applying a light emitting layer on the hole injection layer; applying a cathode electrode layer on the light emitting layer; and drying to give the organic electroluminescent device.

2. The method for preparing an organic electroluminescent device according to claim 1, wherein, in step S1, preparing the metal oxide sol comprises the steps of: dissolving a metal oxide in a solvent to prepare the metal oxide sol having a concentration of 10-35%.

3. The method for preparing an organic electroluminescent device according to claim 2, wherein the metal oxide is zinc oxide or magnesium oxide, and the solvent is a mixture of water and acetic acid in a volume ratio of 1:2; or the metal oxide is vanadium pentoxide, and the solvent is ammonia.

4. The method for preparing an organic electroluminescent device according to claim 1, wherein, when the raw material for forming the hole injection layer is a metal oxide sol, the process of spin coating comprises: a rotational speed of 500-2000 rpm, and a coating time of 30 s; and the drying process comprises: a drying temperature of 50-200° C., and a drying time of 15-60 min.

5. The method for preparing an organic electroluminescent device according to claim 1, wherein the thiophene compound is poly(3-hexyl thiophene), poly(3-methyl thiophene), poly(3-octyloxy thiophene) or poly(3-dodecyl thiophene); and the organic solvent is at least one of chlorobenzene, xylene, tetrahydrofuran, trichloromethane or dichloromethane.

6. The method for preparing an organic electroluminescent device according to claim 1, wherein, when the raw material for forming the hole injection layer is a thiophene compound sol, the process of spin coating comprises: a rotational speed of 500-2500 rpm, and a coating time of 30 s; and the drying process comprises: a drying temperature of 50-200° C., and a drying time of 15-100 min.

7. The method for preparing an organic electroluminescent device according to claim 3, wherein, when the raw material for forming the hole injection layer is a metal oxide sol, the process of spin coating comprises: a rotational speed of 500-2000 rpm, and a coating time of 30 s; and the drying process comprises: a drying temperature of 50-200° C., and a drying time of 15-60 min.

8. The method for preparing an organic electroluminescent device according to claim 5, wherein, when the raw material for forming the hole injection layer is a thiophene compound sol, the process of spin coating comprises: a rotational speed of 500-2500 rpm, and a coating time of 30 s; and the drying process comprises: a drying temperature of 50-200° C., and a drying time of 15-100 min.

* * * * *